United States Patent
Du et al.

(10) Patent No.: US 10,516,415 B2
(45) Date of Patent: Dec. 24, 2019

(54) METHOD OF COMPRESSING CONVOLUTION PARAMETERS, CONVOLUTION OPERATION CHIP AND SYSTEM

(71) Applicant: Kneron, Inc., San Diego, CA (US)

(72) Inventors: Li Du, La Jolla, CA (US); Yuan Du, Los Angeles, CA (US); Jun-Jie Su, San Diego, CA (US); Ming-Zhe Jiang, San Diego, CA (US)

(73) Assignee: KNERON, INC., San Diego, CA (US)

( * ) Notice: Subject to any disclaimer, the term of this patent is extended or adjusted under 35 U.S.C. 154(b) by 51 days.

(21) Appl. No.: 15/893,294

(22) Filed: Feb. 9, 2018

(65) Prior Publication Data

US 2019/0253071 A1    Aug. 15, 2019

(51) Int. Cl.
| | | |
|---|---|---|
| *H03M 7/30* | (2006.01) | |
| *H03H 21/00* | (2006.01) | |
| *G06F 17/15* | (2006.01) | |
| *G06N 3/04* | (2006.01) | |

(52) U.S. Cl.
CPC ............ *H03M 7/70* (2013.01); *G06F 17/15* (2013.01); *H03H 21/0012* (2013.01); *G06N 3/04* (2013.01)

(58) Field of Classification Search
CPC ...... G06N 3/063; G06F 17/15; H03M 7/3057; H03M 7/3059
USPC ......................................... 708/203, 315, 420
See application file for complete search history.

(56) References Cited

U.S. PATENT DOCUMENTS

| | | | |
|---|---|---|---|
| 2018/0239992 A1* | 8/2018 | Chalfin | G06K 9/66 |
| 2019/0080222 A1* | 3/2019 | Glesner | G06N 3/04 |
| 2019/0102673 A1* | 4/2019 | Leibovich | G06N 3/08 |

FOREIGN PATENT DOCUMENTS

WO    WO2017129325 A1    8/2017

OTHER PUBLICATIONS

Y. Wang, et al., A Case of On-Chip Memory Subsystem Design for Low-Power CNN Accelerators, IEEE, p. 1971-1984, 2017 (Year: 2017).*
Y. Kawano et al., Low-Bit Representation of Linear Classifier Weights for Mobile Large-Scale Image Classification, 2015 3rd IAPR Asian Conference on Pattern Recognition, p. 489-493, 2015 (Year: 2015).*
J. H. Ko et al., Adaptive Weight Compression for Memory-Efficient Neural Networks, EDAA, p. 199-204, 2017 (Year: 2017).*

* cited by examiner

*Primary Examiner* — Andrew Caldwell
*Assistant Examiner* — Emily E Larocque
(74) *Attorney, Agent, or Firm* — Muncy, Geissler, Olds & Lowe, P.C.

(57) ABSTRACT

A method for compressing multiple original convolution parameters into a convolution operation chip includes steps of: determining a range of the original convolution parameters; setting an effective bit number for the range; setting a representative value, wherein the representative value is within the range; calculating differential values between the original convolution parameters and the representative value; quantifying the differential values to a minimum effective bit to obtain a plurality of compressed convolution parameters; and transmitting the effective bit number, the representative value and the compressed convolution parameters to the convolution operation chip.

13 Claims, 6 Drawing Sheets

METHOD OF COMPRESSING CONVOLUTION PARAMETERS, CONVOLUTION OPERATION CHIP AND SYSTEM

BACKGROUND

Technology Field

The disclosure relates to a convolution operation device and system and, in particular, to a method of compressing convolution parameters, a convolution operation chip and a convolution operation system.

Description of Related Art

Deep learning is an important technology for developing artificial intelligence (AI). In the recent years, the convolutional neural network (CNN) is developed and applied in the identification of the deep learning field. Compared with other deep learning architectures, especially in the mode classification field such as picture and voice identifications, the convolutional neural network can directly process the original pictures or data without the complex preprocessing. Thus, it becomes more popular and has a better identification result.

However, the convolution operation usually consumes a lot of performance for calculating a huge amount of data. In addition, the data transmission in a limited bandwidth can also be a bottleneck during the calculation. For example, to transmit the weight coefficients or filter coefficients from the external device to the convolution operation chip will occupy a lot of bandwidth. Therefore, it is desired to provide a method, a device and a system that can reduce the required transmission amount of convolution parameters.

SUMMARY

In view of the foregoing, this disclosure provides a method, a device and a system that can reduce the required transmission amount of convolution parameters.

To achieve the above, this disclosure provides a method for compressing multiple original convolution parameters into a convolution operation chip, comprising steps of: determining a range of the original convolution parameters; setting an effective bit number for the range; setting a representative value, wherein the representative value is within the range; calculating differential values between the original convolution parameters and the representative value; quantifying the differential values to a minimum effective bit to obtain a plurality of compressed convolution parameters; and transmitting the effective bit number, the representative value and the compressed convolution parameters to the convolution operation chip.

In one embodiment, the original convolution parameters are filter coefficients or weight coefficients of filters.

In one embodiment, the representative value is an average value, a maximum value or a minimum value of the original convolution parameters.

In one embodiment, the step of determining the range of the original convolution parameters comprises determining a maximum value and a minimum value of the original convolution parameters.

In one embodiment, a minimum effective bit of the original convolution parameters is equal to the minimum effective bit of the differential values.

In one embodiment, the step of setting the effective bit number for the range is to set the effective bit number according to a minimum effective bit of the original convolution parameters.

In addition, the disclosure also provides a convolution operation chip coupled to an external device. The convolution operation chip includes a memory, a convolution operation module and a control module. The memory stores a plurality of convolution operation input values. The convolution operation module is coupled to the memory for retrieving the convolution operation input values. The control module is coupled to the memory and the convolution operation module and connects to the external device for receiving an effective bit number, a representative value, and a plurality of compressed convolution parameters. The control module decompresses the compressed convolution parameters according to the effective bit number and the representative value to obtain a plurality of decompressed convolution parameters. The convolution operation module performs a convolution operation according to the decompressed convolution parameters and the convolution operation input values.

In one embodiment, the decompressed convolution parameters are served as filter coefficients or weight coefficients of filters.

In one embodiment, the representative value is an average value, a maximum value or a minimum value of the plurality of original convolution parameters.

In one embodiment, the compressed convolution parameters represent differential values of the original convolution parameters and the representative value.

In one embodiment, the decompressed convolution parameters is not processed with a reverse quantization for recovering the original convolution parameters.

In addition, this disclosure further provides a convolution operation system, which includes an external device and a convolution operation chip. The external device is configured to preform: determining a range of a plurality of original convolution parameters; setting an effective bit number for the range; setting a representative value, wherein the representative value is within the range; calculating differential values between the original convolution parameters and the representative value; and quantifying the differential values to a minimum effective bit to obtain a plurality of compressed convolution parameters. The convolution operation chip is coupled to the external device and includes a memory, a convolution operation module, and a control module. The memory stores a plurality of convolution operation input values. The convolution operation module is coupled to the memory for retrieving the convolution operation input values. The control module is coupled to the memory and the convolution operation module and connects to the external device for receiving the effective bit number, the representative value, and the plurality of compressed convolution parameters. The control module decompresses the compressed convolution parameters according to the effective bit number and the representative value to obtain a plurality of decompressed convolution parameters. The convolution operation module performs a convolution operation according to the decompressed convolution parameters and the convolution operation input values.

In one embodiment, the original convolution parameters are filter coefficients or weight coefficients of filters.

In one embodiment, the representative value is an average value, a maximum value or a minimum value of the original convolution parameters.

In one embodiment, the external device determines a maximum value and a minimum value of the original convolution parameters.

In one embodiment, a minimum effective bit of the original convolution parameters is equal to the minimum effective bit of the differential values.

In one embodiment, the external device sets the effective bit number according to a minimum effective bit of the original convolution parameters.

In one embodiment, the decompressed convolution parameters is not processed with a reverse quantization for recovering the original convolution parameters.

As mentioned above, the method for compressing multiple original convolution parameters into a convolution operation chip, the convolution operation chip and the convolution operation system of this disclosure can reduce the data transmission amount by the data compression technology instead of directly transmitting the original convolution parameters to the convolution operation chip. Accordingly, this disclosure can prevent the over consumption of the bandwidth occupied by the transmitted convolution parameters. Thus, more data or parameters can be transmitted through the limited bandwidth, thereby increasing the processing performance.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

Figure 1:
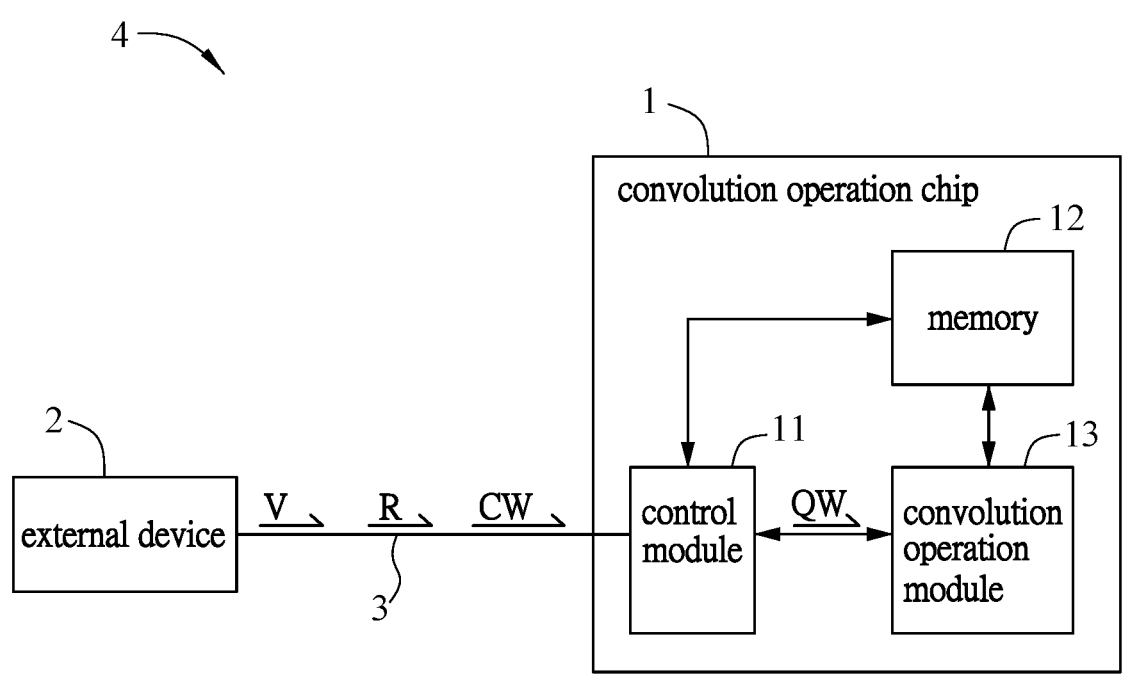
FIG. 1 is a block diagram of a convolution operation system according to an embodiment of the disclosure.

FIG. 1 is a block diagram of a convolution operation system 4 according to an embodiment of the disclosure. Referring to FIG. 1, the convolution operation system 4 includes an external device 2, a transmission channel 3, and a convolution operation chip 1. The transmission channel 3 couples to the external device 2 and the convolution operation chip 1. In practice, the transmission channel 3 can be a Bus or a transmission line. The convolution operation chip can be applied to the convolution neural network (CNN). The convolutional neural network has a plurality of operation layers, such as the convolutional layer or the convolution and pooling layers. The output of each operation layer is an intermediate result, which can be functioned as the input of another layer or any consecutive layer. For example, the output of the N−1 operation layer is the input of the N operation layer or any consecutive layer, the output of the N operation layer is the input of the N+1 operation layer or any consecutive layer, and so on. The filters of different layers can be the same or different.

The convolution operation chip 1 includes a memory 12, a convolution operation module 13, and a control module 11. The memory 12 stores a plurality of convolution operation input values. The convolution operation module 13 is coupled to the memory 12 for retrieving the convolution operation input values. The control module 11 is coupled to the memory 12 and the convolution operation module 13, and connected to the external device 2 through the transmission channel 3.

The memory 12 stores the convolution operation input values (for the following convolution operations) and the convolution operation results. The convolution operation result can be an intermediate result or a final result. The input values or results can be, for example, image data, video data, audio data, statistics data, or the data of any layer of the convolutional neural network. The image data may contain the pixel data. The video data may contain the pixel data or movement vectors of the frames of the video, or the audio data of the video. The data of any layer of the convolutional neural network are usually 2D array data. The image data are usually 2D array pixel data. In addition, the memory 12 may include multiple layers of storage structures for individually storing the data to be processed and the processed data. In other words, the memory 12 can be functioned as a cache of the convolution operation device.

The convolution operation input values for following convolution operations can be stored in other places, such as another memory or an external memory outside the convolution operation chip 1. For example, the external memory or another memory can be optionally a DRAM (dynamic random access memory) or other kinds of memories. When the convolution operation chip 1 performs the convolution operation, these data can be totally or partially loaded to the memory 12 from the external memory or another memory, and then the convolution operation module 13 can access these data from the memory 12 for performing the following convolution operation.

The convolution operation module 13 includes one or more convolution units. Each convolution unit executes a convolution operation based on a filter and a plurality of current convolution operation input values for generating convolution operation results. The generated convolution operation results can be outputted to and stored in the memory 12. One convolution unit can execute an m×m convolution operation. In more detailed, the convolution operation input values include m values, and the filter includes m filter coefficients. Each convolution operation input value is multiplied with one corresponding filter coefficient, and the total multiplying results are added to obtain the convolution operation result of the convolution unit.

In the application of convolution neural network, the convolution operation results are stored in the memory 12. Accordingly, when the convolution operation module 13 performs the convolution operation for next convolution layer, the data can be rapidly retrieved from the memory 12 as the inputs of the convolution operation. The filter includes a plurality of filter coefficients, and the convolution operation module 13 can directly retrieve the filter coefficients from external memory by direct memory access (DMA).

Each of the convolution operation input values, the filter coefficients and convolution operation results includes an integer part and a fractional part, and the widths of these data are the same. In general, the CNN adopts the fixed point format to show the filter coefficients and the intermediate results. In other words, the inputs and outputs of all operation layers all adopt the same fixed point format. The fixed point format includes an integer part and a fractional part. The integer part has j bits, and the fractional part has k bits. For example, the 16-bit fixed point data usually have an 8-bit integer part and an 8-bit fractional part, and the leftmost bit of the integer part may be a sign bit.

Figure 2A:
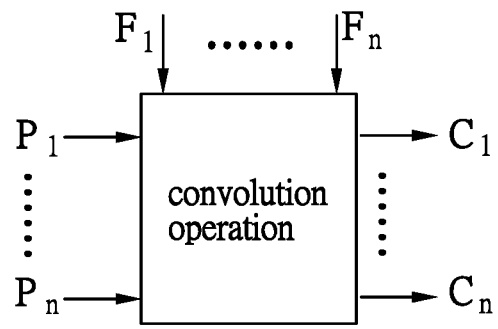
FIGS. 2A and 2B are schematic diagrams showing a layer of convolution operation in a convolutional neural network.
Figure 2B:
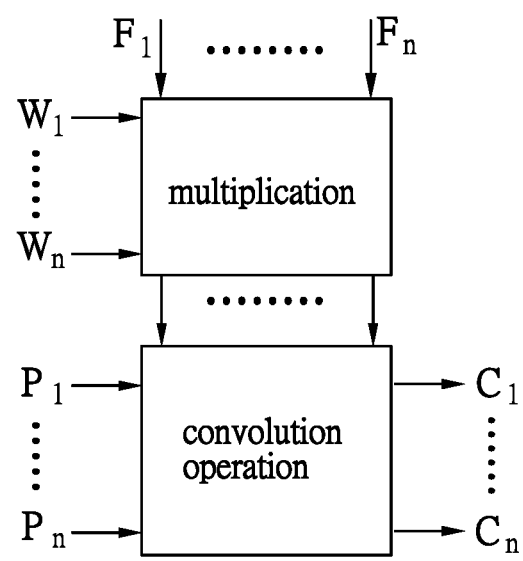

FIGS. 2A and 2B are schematic diagrams showing the convolution operations of one layer in the convolution neural network. As shown in FIG. 2A, in the convolution layer, a plurality of data P1~Pn and a plurality of filter coefficients F1~Fn are provided to execute a convolution operation for generating a plurality of data C1~Cn. The data P1~Pn represent the convolution operation input values CI containing fractional parts, and the data C1~Cn represent the convolution operation results CO containing fractional parts. The filter coefficients F1~Fn can be weighted or not. In the case of FIG. 2A, the filter coefficients F1~Fn are not weighted, so the original filter coefficients F1~Fn are directly provided for the convolution operation. The weighting step is to multiply the original filter coefficients F1~Fn by one or more weight values. In the case of FIG. 2B, the original filter coefficients F1~Fn are multiplied by multiple weight values W1~Wn, and the weighted filter coefficients are then provided for the convolution operation. The original convolution parameters of FIG. 1 can be the filter coefficients F1~Fn of FIG. 2A or the weight values W1~Wn of FIG. 2B.

Figure 3:
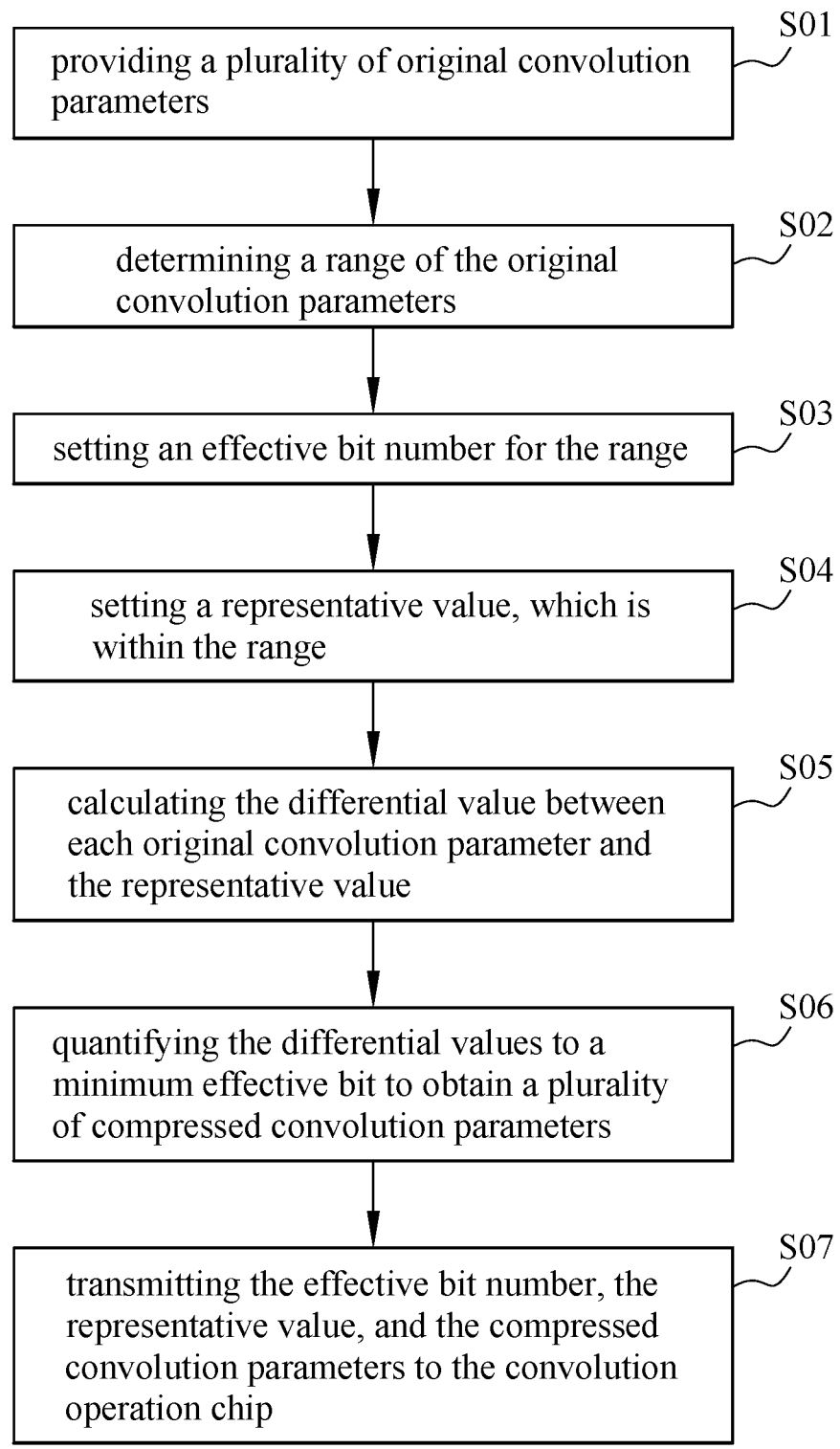
FIG. 3 is a flow chart of a method for compressing original convolution parameters.

FIG. 3 is a flow chart of a method for compressing original convolution parameters. As shown in FIG. 3, the external device 2 of FIG. 1 is configured to perform the steps S01 to S07.

In the step S01, the external device 2 provides a plurality of original convolution parameters. The original convolution parameters can be the filter coefficients or weight coefficients of the filter coefficients used in the convolution operation.

Figure 4A:
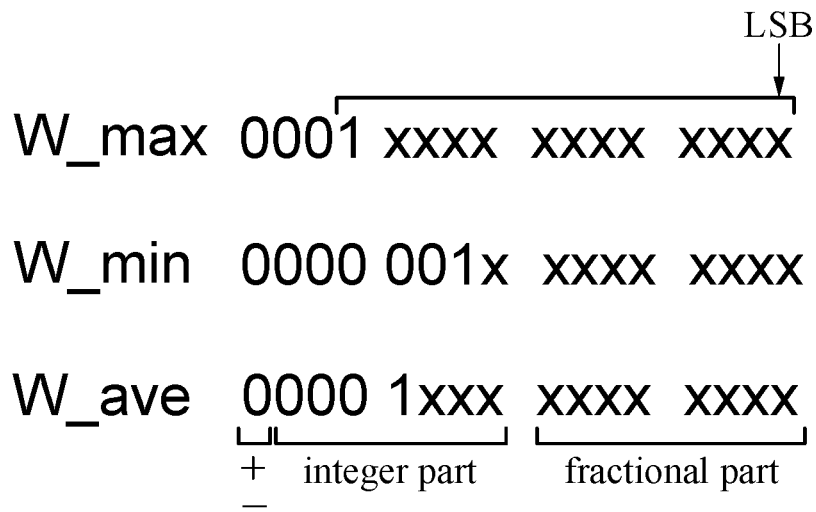
FIGS. 4A and 4B are schematic diagrams showing the compressed original convolution parameters.
Figure 4B:
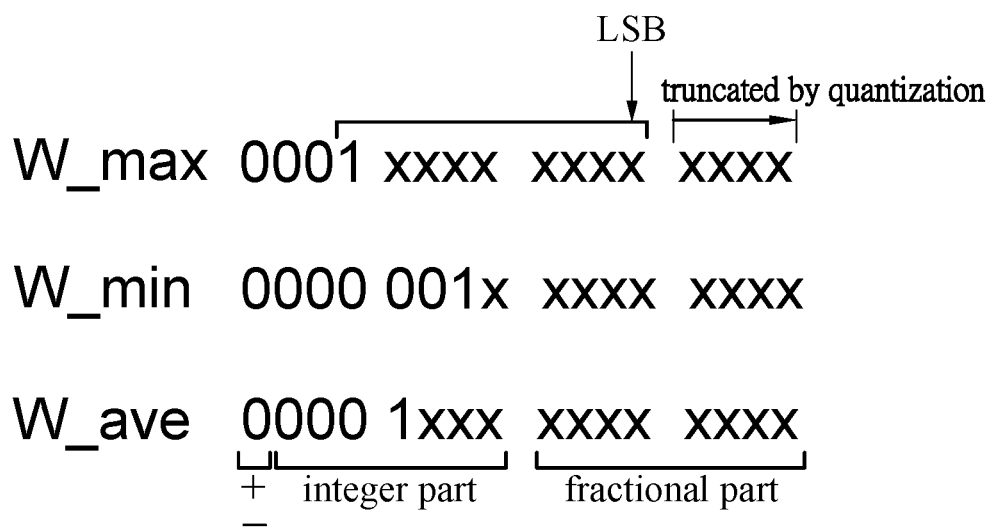

In the step S02, the external device 2 determines a range of the original convolution parameters. For example, as shown in FIGS. 4A and 4B, the step S02 is to retrieve the maximum value W_max and the minimum value W_min of the original convolution parameters, and then to subtract the maximum value W_max by the minimum value W_min to obtain the differential value thereof, which is defined as the range.

In the step S03, the external device 2 sets an effective bit number for the range. For example, if the range is 0, the integer part of the effective bit number is 0 bit, and the bit number of the fractional part thereof is equal to the bit number of the fractional part of the original convolution parameters. Based on this rule, if the range is 1, the integer part of the effective bit number is 1 bit; if the range is 2-3, the integer part of the effective bit number is 2 bit; if the range is 4-7, the integer part of the effective bit number is 3 bit; and if the range is between $2^{n-1}$ and $2^n-1$, the integer part of the effective bit number is n bit. The bit number of the fractional part of the effective bit number is equal to the bit number of the fractional part of the original convolution parameters.

If the range is defined as an integer (not including the integer part and the fractional part), the above-mentioned setting method is also applicable. That is, if the range is between $2^{n-1}$ and $2^n-1$, the effective bit number is n bit. According to this expression method, the sign bit and the "0s" of the front portion of the inter part are not needed to be transmitted to the chip 1 during the following transmission of compressed parameters.

In the step S04, the external device 2 sets a representative value, which is within the range. As shown in FIGS. 4A and 4B, the representative value is between the maximum value W_max and the minimum value W_min of the original convolution parameters (including the maximum value W_max and the minimum value W_min). For example, the representative value can be an average value W_ave, the maximum value W_max, or the minimum value W_min of the original convolution parameters.

In the step S05, the external device 2 calculates the differential value between each original convolution parameter and the representative value. If the representative value is an average value, it means that the bit number for representing the differential value can be further reduced by 1 bit. In more specific, when the effective bit number set and obtained in the step S03 is n bits, the differential value will be (n−1) bits, so that the transmission amount can be further reduced. When the effective bit number is set as another value, the differential value will be n bits. The process of the previous step can reduce the transmission amount of high bits, and the transmission amount of low bits can be further reduced by quantifying the minimum effective bit. For example, the minimum effective bit of the original convolution parameters is equal to the minimum effective bit of the differential value. Thus, the step S05 can set the effective bit number according to the minimum effective bit of the original convolution parameters. In this case, the effective bit number is equal to the bit number for the differential value minus the bit number of the right side beyond the minimum effective bit. For example, if the minimum effective bit is m and the representative value is an average value, the bit width to be transmitted will be ((n−1)−m+1). If the representative value is not the average value, the bit width to be transmitted will be (n−m+1).

In the step S06, the external device 2 quantifies the differential values to a minimum effective bit to obtain a plurality of compressed convolution parameters. This step can truncate the bits less than the minimum effective bit (excluding the minimum effective bit), thereby further reducing the bit number to be transmitted. For example, if the minimum effective bit is 3, the rightmost two bits will be truncated in the quantifying step.

As shown in FIG. 4A, the minimum effective bit is 1, so there is no any right-side bit to be quantified and truncated. If the representative value is the average value, the bit width to be transmitted will be ((n−1)−m+1)=(n−1). As shown in FIG. 4B, the minimum effective bit is 5, so there are four right-side bits to be quantified and truncated. If the representative value is the average value, the bit width to be transmitted will be ((n−1)−m+1)=(n−1−4+1)=(n−4).

In addition, the representative value R can also be processed by the quantifying step. The external device 2 can quantity the representative value R to the minimum effective bit. This step can truncate the bits less than the minimum effective bit (excluding the minimum effective bit), thereby further reducing the bit number to be transmitted. For example, if the minimum effective bit is 3, the rightmost two bits will be truncated in the quantifying step.

In the step S07, the external device 2 transmits the effective bit number V, the representative value R, and the compressed convolution parameters CW1~CWX to the convolution operation chip 1. As shown in FIG. 5B, a compressed parameter group includes the effective bit number V, the representative value R, and the compressed convolution parameters CW1~CWX. Herein, X represents the number of the compressed convolution parameters. During the transmission procedure, the effective bit number V is transmitted firstly, so that the convolution operation chip 1 can realize the width of the following compressed convolution parameters, thereby receiving and retrieving the compressing coefficient. The transmission order of the representative value R and the effective bit number V is not limited. If the representative value R is transmitted prior than the effective bit number V (the compression coefficient), the convolution operation chip 1 can start the decompression procedure as early as possible. The representative value R and the effective bit number V can have a fixed width. For example, the width of the representative value R and the effective bit number V can be equal to the width of the original convolution parameters W1~WX. In addition, if the representative value R is processed by the quantifying step, the width thereof can still be equal to or less than the width of the original convolution parameters W1~WX. If the width of the representative value R is reduced, the external device 2 must additionally announce the convolution operation chip 1.

Figure 5A:
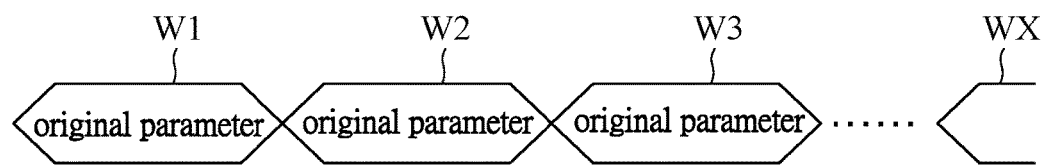
FIGS. 5A and 5B are schematic diagrams showing the transmission of the convolution parameters.
Figure 5B:
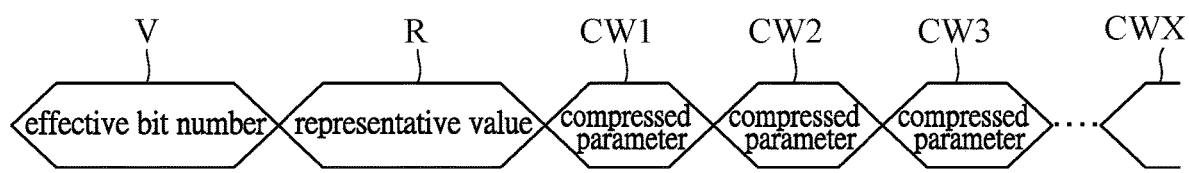

As shown in FIG. 5A, the external device 2 provides a plurality of original convolution parameters W1~WX. When the original convolution parameters W1~WX are weight coefficients, these parameters will be within a certain range in many applications, so that these parameters can be expressed by a smaller bit number. Each of the weight coefficients in the same characteristic block can be represented by less bits. For example, when the original convolution parameters W1~WX are 16-bit fixed point data, which include one sign bit, 7 bits for the integer part, and 8 bits for the fractional part. If the total weight coefficients in one characteristic block are ±2, the weight coefficients can be represented in minimum by one sign bit, 1 bit for the integer part, and 8 bits for the fractional part. Accordingly, the original 16-bit value can be represented by a 10-bit width. Similarly, the compression coefficients of FIG. 5B can reduce the required data width for transmission.

Figure 6:
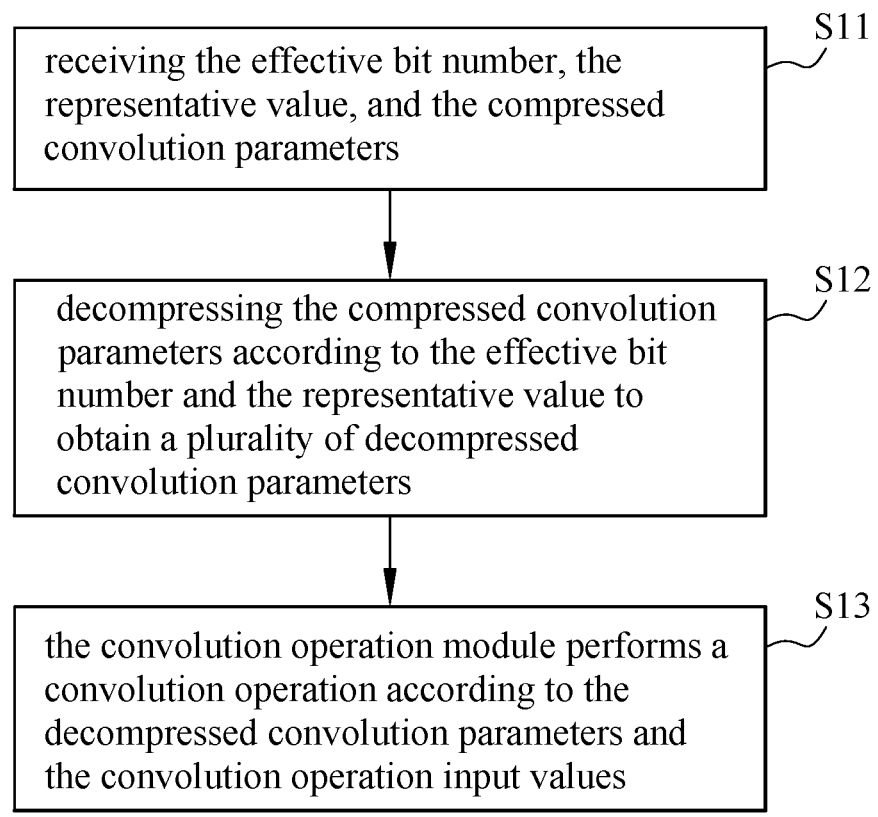
FIG. 6 is a flow chart of a method for decompressing the convolution parameters according to an embodiment of the disclosure.

FIG. 6 is a flow chart of a method for decompressing the convolution parameters according to an embodiment of the disclosure. As shown in FIG. 6, the convolution operation chip 1 of FIG. 1 can be used to perform the steps S11 to S13 of FIG. 6.

In the step S11, the control module 11 receives the effective bit number V, the representative value R, and the compressed convolution parameters CW from the external device 2 through the transmission channel 3. For example, the format of the compressed parameter group of FIG. 5B can be transmitted to the control module 11. After accessing the effective bit number V and the representative value R, the control module 11 can retrieve the compressed convolution parameters CW1~CWX according to the effective bit number V.

In the step S12, the control module 11 decompresses the compressed convolution parameters CW according to the effective bit number V and the representative value R to obtain a plurality of decompressed convolution parameters QW. The representative value R can be an average value, a maximum value or a minimum value of a plurality of original convolution parameters. The compressed convolution parameters CW are the differential values between the original convolution parameters and the representative value R. Accordingly, the compressed convolution parameters CW will be the quantified differential values processed by the step S06. The decompressed convolution parameters QW obtained by this step S12 can be processed by a reverse quantization and be recovered to obtain the original convolution parameters. The reverse quantization is to recover the minimum effective bit to the value before the quantifying step. In order to perform the reverse quantization, the control module 11 needs to receive the information of the original minimum effective bit from the external device 2 and then performs the reverse quantization to the decompressed convolution parameters QW according to the received information.

In the step S13, the convolution operation module 13 performs a convolution operation according to the decompressed convolution parameters QW and the convolution operation input values. The convolution operation input values are read from the memory 12 and then inputted to the convolution operation module 13. The decompressed convolution parameters QW are served as filter coefficients or weight coefficients of filters.

For example, if the reverse quantization for recovering from the decompressed convolution parameters QW to the original convolution parameters is not performed, the decompressed convolution parameters QW can be directly used as the filter coefficients or the weight coefficients of filters. This operation is suitable for the application that focusing on the ratio of the convolution operation results, which is not focusing on the values of the convolution operation results.

For example, the reverse quantization for recovering from the decompressed convolution parameters QW to the original convolution parameters can be performed, and the recovered original convolution parameters are then outputted to the convolution operation module 13. This operation is suitable for the application that focusing on the values of the convolution operation results.

In the above embodiments, the memory 12 can be a cache or register inside the chip. For example, the memory 12 can be an SRAM (static random-access memory). The control module 11 and the convolution operation module 13 can be the logic circuits inside the chip.

In summary, the method for compressing multiple original convolution parameters into a convolution operation chip, the convolution operation chip and the convolution operation system of this disclosure can reduce the data transmission amount by the data compression technology instead of directly transmitting the original convolution parameters to the convolution operation chip. Accordingly, this disclosure can prevent the over consumption of the bandwidth occupied by the transmitted convolution parameters. Thus, more data or parameters can be transmitted through the limited bandwidth, thereby increasing the processing performance.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A method for compressing multiple original convolution parameters into a convolution operation chip, comprising steps of:
   determining a range of the original convolution parameters;
   setting an effective bit number for the range;
   setting a representative value, wherein the representative value is within the range, wherein the representative value is an average value, a maximum value or a minimum value of the original convolution parameters;

calculating differential values between the original convolution parameters and the representative value;

quantifying the differential values to a minimum effective bit to obtain a plurality of compressed convolution parameters; and transmitting the effective bit number, the representative value and the compressed convolution parameters to the convolution operation chip, so that decompressed convolution parameters from the effective bit number, the representative value and the compressed convolution parameters are directly used in a convolution operation without a reverse quantization.

2. The method according to claim 1, wherein the original convolution parameters are filter coefficients or weight coefficients of filters.

3. The method according to claim 1, wherein the step of determining the range of the original convolution parameters comprises determining the maximum value and the minimum value of the original convolution parameters.

4. The method according to claim 1, wherein a minimum effective bit of the original convolution parameters is equal to the minimum effective bit of the differential values.

5. The method according to claim 1, wherein the step of setting the effective bit number for the range is to set the effective bit number according to a minimum effective bit of the original convolution parameters.

6. A convolution operation chip, comprising:

a memory storing a plurality of convolution operation input values;

a convolution operation module coupled to the memory for retrieving the convolution operation input values; and a control block coupled to the memory and the convolution operation module and configured to receive an effective bit number, a representative value, and a plurality of compressed convolution parameters, wherein the representative value is an average value, a maximum value or a minimum value of a plurality of original convolution parameters, wherein the control block decompresses the compressed convolution parameters according to the effective bit number and the representative value to obtain a plurality of decompressed convolution parameters, the decompressed convolution parameters is not processed with a reverse quantization for recovering the original convolution parameters, and the convolution operation module performs a convolution operation directly according to the decompressed convolution parameters and the convolution operation input values.

7. The convolution operation chip according to claim 6, wherein the decompressed convolution parameters are served as filter coefficients or weight coefficients of filters.

8. The convolution operation chip according to claim 6, wherein the compressed convolution parameters represent differential values of the original convolution parameters and the representative value.

9. A convolution operation system, comprising:

a computing device configured to perform:

determining a range of a plurality of original convolution parameters, setting an effective bit number for the range, setting a representative value, wherein the representative value is within the range, wherein the representative value is an average value, a maximum value or a minimum value of the original convolution parameters, calculating differential values between the original convolution parameters and the representative value, and quantifying the differential values to a minimum effective bit to obtain a plurality of compressed convolution parameters; and a convolution operation chip coupled to the computing device and comprising:

a memory storing a plurality of convolution operation input values, a convolution operation module coupled to the memory for retrieving the convolution operation input values, and a control block coupled to the memory and the convolution operation module and connected to the computing device for receiving the effective bit number, the representative value, and the plurality of compressed convolution parameters, wherein the control block module decompresses the compressed convolution parameters according to the effective bit number and the representative value to obtain a plurality of decompressed convolution parameters, the decompressed convolution parameters is not processed with a reverse quantization for recovering the original convolution parameters, and the convolution operation module performs a convolution operation directly according to the decompressed convolution parameters and the convolution operation input values.

10. The system according to claim 9, wherein the original convolution parameters are filter coefficients or weight coefficients of filters.

11. The system according to claim 9, wherein the computing device determines the maximum value and the minimum value of the original convolution parameters.

12. The system according to claim 9, wherein a minimum effective bit of the original convolution parameters is equal to the minimum effective bit of the differential values.

13. The system according to claim 9, wherein the computing device sets the effective bit number according to a minimum effective bit of the original convolution parameters.

* * * * *